United States Patent [19]

Esquivel et al.

[11] Patent Number: 4,855,800
[45] Date of Patent: Aug. 8, 1989

[54] EPROM WITH INCREASED FLOATING GATE/CONTROL GATE COUPLING

[75] Inventors: Agerico L. Esquivel, Dallas, Tex.; Robert Groover, III, Arlington, Va.; Howard L. Tigelaar, Allen, Tex.

[73] Assignee: Texas Instruments Incorporated, Dallas, Tex.

[21] Appl. No.: 96,176

[22] Filed: Sep. 11, 1987

Related U.S. Application Data

[63] Continuation-in-part of Ser. No. 844,915, Mar. 27, 1986, Pat. No. 4,698,900.

[51] Int. Cl.$^4$ .................. H01L 29/78; H01L 29/52; H01L 29/06
[52] U.S. Cl. ................. 357/23.5; 357/23.6; 357/23.11; 357/47; 357/49; 357/55; 365/185
[58] Field of Search ................. 357/23.5, 23.6, 23.11, 357/47, 49, 55; 365/185

[56] References Cited

U.S. PATENT DOCUMENTS

| | | | |
|---|---|---|---|
| 4,377,818 | 3/1983 | Kuo et al. | 357/23.5 |
| 4,477,310 | 10/1984 | Park et al. | 357/23.11 |
| 4,561,004 | 12/1985 | Kio et al. | 357/23.5 |
| 4,597,060 | 6/1986 | Mitchell et al. | 357/23.5 |
| 4,612,629 | 9/1986 | Harari | 357/23.5 |
| 4,686,558 | 8/1987 | Adam | 357/23.5 |
| 4,698,900 | 10/1987 | Esquirel | 437/225 |
| 4,729,006 | 3/1988 | Dally et al. | 357/23.11 |
| 4,750,024 | 6/1988 | Schreck | 357/23.5 |

Primary Examiner—Andrew J. James
Assistant Examiner—Jerome Jackson, Jr.
Attorney, Agent, or Firm—Rodney M. Anderson; Leo N. Heiting; Melvin Sharp

[57] ABSTRACT

Disclosed is a floating gate memory array having high-speed programming capabilities. Diffused buried bit lines (14) are formed spaced apart in a semiconductor, forming conduction channels therebetween. Dielectric-filled trenches (24) are formed between the bit lines (14). An insulated floating gate conductor (18) and an insulated control gate conductor (23) are formed over the wafer and patterned to extend over the dielectric-filled trenches (24). The enhanced coupling efficiency between the control gate (23) and the floating gate (18) enhances the programmability of the memory cells.

14 Claims, 6 Drawing Sheets

EPROM WITH INCREASED FLOATING GATE/CONTROL GATE COUPLING

RELATED APPLICATIONS

This is a continuation-in-part application of an application entitled "METHOD OF MAKING NON-VOLATILE MEMORY HAVING DIELECTRIC FILLED TRENCHES", by Agerico L. Esquivel, filed Mar. 27, 1986, Ser. No. 844,915, now U.S. Pat. No. 4,698,900, issued Oct. 13, 1987.

TECHNICAL FIELD OF THE INVENTION

The present invention relates in general to nonvolatile semiconductor memories, and more particularly relates to erasable read-only memory devices, and methods of fabrication thereof

BACKGROUND OF THE INVENTION

Read-only memories (ROMs) are a type of memory in which data can be permanently stored, for example, by blowing metallic links during programming thereof. Such type of memory can be conventionally accessed at specific locations to read the programmed contents thereof. A much more versatile type of ROM is the electrically programmable read-only memory (EPROM) which can be electrically programmed to permanently store data. No fusible links, or the like, are blown, as is the case with the noted ROMs, to permanently establish data therein. EPROMs rely on a charge tunnelling phenomenon to permanently store a charge in an electrical conductor of each cell. Avalanche and Fowler-Nordheim effects are examples of the tunnelling phenomenon. Essentially, an EPROM cell is programmed by applying certain voltages thereto, sufficient to draw electron charges through a thin insulator and become trapped in a conductive material. The conductive material can be polycrystalline silicon (polysilicon) or silicon nitride. The voltages applied to the cell for reading the contents thereof are insufficient to release the trapped charges, and thus once electrically programmed, the cell retains the information for a long period of time.

The construction of an EPROM cell is similar to that of a field effect transistor, but additionally includes a floating gate between the gate conductor and the conduction channel of the transistor. During programming to store a desired logic state, electrons flowing in the conduction channel are attracted and trapped in the floating gate. This condition increases the threshold voltage of the transistor, thereby rendering it cutoff in response to normal read operation voltages Hence, during reading of a transistor cell so programmed, the transistor will remain nonconductive and thus represent a high impedance between the source and drain terminals which also comprise bit lines. When it is desired to store another digital state in the cell, such cell is simply not programmed, and thus no charge is retained in the floating gate. The nonprogrammed transistor cell is thus characterized with a normal threshold voltage, and is responsive to read operation voltages by being driven into conduction and exhibiting a low impedance between the bit lines In the semiconductor memory technology, there is a constant effort to construct devices with higher switching speeds and with higher circuit densities to accommodate more cells per unit of wafer area. The development of EPROM memories are no exception, and indeed, EPROM cells have been scaled so that the geometry thereof is reduced to the extent that a one megabit EPROM memory array is feasible. One problem attendant with the scaling of EPROM cells is that with smaller gate conductors and correspondingly smaller floating gates, the coupling efficiency thereof is reduced. Therefore, a programmed cell of this type exhibits a lower threshold due to fewer charges being trapped in the floating gate This can be overcome by increasing the programming voltage, or the programming time in which free carriers are collected and retained in the floating gate. Both such measures are suboptimal, in that with higher programming voltages the geometric dimensions of some of the cell features are required to be increased for voltage breakdown purposes By requiring a longer programming time of each cell, it is apparent that the additive effect thereof requires a substantially longer programming time for the array, especially in one megabit memory arrays.

From the foregoing, it can be seen that a need exists for an EPROM cell and memory array, and method of fabrication thereof, which provides a greater coupling efficiency between the control gate and the floating gate without compromising other features of the memory. An associated need exists for an EPROM cell having a greater common lateral area between the control gate and floating gate, without increasing the dimensions of the cell itself. A more particular need exists for an EPROM memory cell having such improved coupling efficiency without requiring additional complicated fabrication masks or steps.

SUMMARY OF THE INVENTION

In accordance with the present invention, the disclosed EPROM cell and array, and the method of fabrication thereof, substantially reduce or eliminate the disadvantages and shortcomings associated with the prior art techniques. A primary technical advantage presented by the invention is that the coupling efficiency between the control gate and floating gate of each cell is increased by increasing the lateral area thereof, but without increasing the overall wafer area required of each cell. An additional technical advantage in constructing the EPROM control gate and floating gate according to the invention is that the capacity of coupling therebetween is increased, without also increasing the capacitive coupling between the control gate and the underlying semiconductor substrate. Each cell can thereby be programmed to predefined thresholds using faster programming speeds. An additional technical advantage of the invention is that the coupling area between the control gate and the floating gate can be increased without requiring additional or special mask sets or processing techniques. A further technical advantage is achieved in reducing undesired fringing electric fields at the lower corners of the floating gate by forming such gate structures at least partially overlying dielectric-filled trenches.

In accordance with the EPROM cell of the invention, there are formed buried diffused bit lines spaced apart to form a conduction channel of each transistor cell. Trenches are formed on each side of the conduction channel and filled with a high quality dielectric to decrease leakage between the bit lines, as well as to improve programming time and increase the threshold of the programmed cells. A floating gate is formed over and electrically isolated from the conduction channel.

A control gate, or word line, is formed above the floating gate, and isolated therefrom. The control gate and floating gate extend laterally beyond the channel area over the dielectric-filled trenches. With such a structure, the coupling area between the control gate and floating gate of each cell is increased, without a corresponding increase in the coupling area between the control gate and the channel area. Because the dielectric-filled trenches comprise a nonactive area of the wafer, the cell size need not be increased to accommodate the larger area of the control and floating gates. The increase in the coupling area between the control gate and the floating gate may be realized by extending the lateral area of such gates on one or both sides of the cell, and can be realized by varying the geometrical size and shape of each such extension.

With an increased coupling efficiency between the control gate and floating gate, the EPROM cell of the invention can be programmed with reduced control gate voltage, or with a reduced width of the programming pulse applied to the bit line.

BRIEF DESCRIPTION OF THE DRAWINGS

Further features and advantages will become apparent from the following and more particular description of the preferred embodiment of the invention, as illustrated in the accompanying drawings in which like reference characters generally refer to the same areas, regions or elements throughout the views, and in which.

DETAILED DESCRIPTION OF THE INVENTION

The making and use of the presently preferred embodiments are discussed below in detail However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

Figure 1:
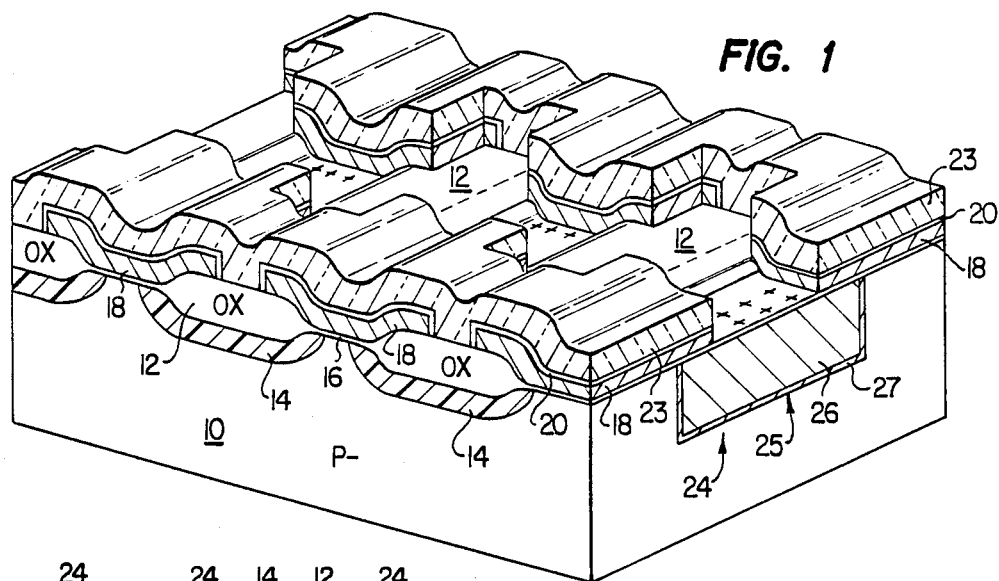
FIG. 1 shows a sample embodiment of the present invention, in an EPROM structure with buried N+. bit lines, trench isolation and laterally extended control and floating gate structures.

The process flow described below, and in conjunction with FIG. 1, provides an EPROM with buried N+ bit lines 14 used as the source/drain regions of the FAMOS transistors In forming semiconductor tanks for the memory of the invention, the following steps are employed to define N- wells and P- wells for the peripheral devices. The starting material may be 12-15 ohm-cm P-type expitaxial material 10 which is 12-15 microns thick and <100> crystal orientation, and formed on a P+ substrate (0.01-0.02 ohm-cm). An initial oxidation is performed in steam at 900 C to grow 350 A of oxide. Next, 1400 A of silicon nitride is deposited by conventional LPCVD techniques. A photoresist is then deposited over the wafer and patterned according to the tank pattern. The nitride is then plasma etched according to the tank pattern. An N-type impurity, such as phosphorus, is implanted at 100 keV and $6.0E12 cm^2$ to form the N-wells. The photoresist is then stripped from the wafer.

A 1000 C steam oxidation step is then performed to grow about 5300 A of silicon oxide in locations not protected by the patterned silicon nitride layer. This oxide functions as a "color reversal oxide" to define the P-well pattern, essentially as the complement of the N-well pattern. The nitride is then stripped in hydrogen fluoride (HF) followed by hot phosphoric acid to clean and expose bare silicon which is not protected by the color reversal oxide. A P-type impurity, such as boron-11 is then implanted at 50 keV and $3.0E12 cm^2$ to form the P-wells. The color reversal oxide is then stripped in a solution, e.g. in 10% HF. A thin oxide is then grown overall, and the tank implants are activated and driven into the wafer by an 1100 C oxidation step to form 350 A of oxide, with additional heating time in an argon atmosphere.

Processing of the wafer to form moats then proceeds to define regions where the active devices will formed Silicon nitride of approximately $Si_3N_4$, although the composition may not be perfectly stoichiometric, is then deposited to a thickness of about 1400 A. Photoresist is next patterned over the nitride using the MOAT pattern to leave nitride in the regions where active devices will be formed. The exposed nitride, i.e., where the field oxide regions will be formed, is then removed by etching. Boron-11 is implanted at an energy of about 100 keV, and dosage of about $1.0E13 cm^2$. This forms the channel stop under the field oxide regions. The resist covering the nitride is then stripped. A 900 C steam oxidation step is then performed to grow about 9500 A of oxide, which oxide forms the field oxide isolation regions which separate the moat regions from one another. It is to be noted that these field oxidation regions are used generally only in the periphery. The self-aligned thick oxides 12 which form the bit line insulator strips over buried N+ regions in this embodiment are formed by later steps.

The steps which form the bit line diffusions are commenced by defining the buried N+ pattern with photoresist to expose the locations of the bit line diffusions 14. A plasma etch is utilized to clear the remaining nitride from the bit line diffusion locations. The pad oxide underlying the nitride at these locations is then stripped by a dip in 10% HF. An N-type impurity, such as arsenic, is then implanted with an energy of about 50 keV, and a dosage of about $5.0E15cm^2$ to form the bit line diffusions 14. The photoresist is then stripped from the surface of the wafer. The implanted N+ regions 14 are then annealed, and a self-aligned thick oxide 12 is grown over the wafer, in argon at 900 C at 100 minutes. This is followed by a 900 C steam oxidation for long enough to grow 4500 A of oxide 12 over the buried N. regions 14 at about 40 minutes. The remaining nitride is then stripped, using a 1% HF deglaze followed by hot phosphoric acid. The pad oxide under the nitride is also stripped using a quick dip in 1% HF.

Figure 2:
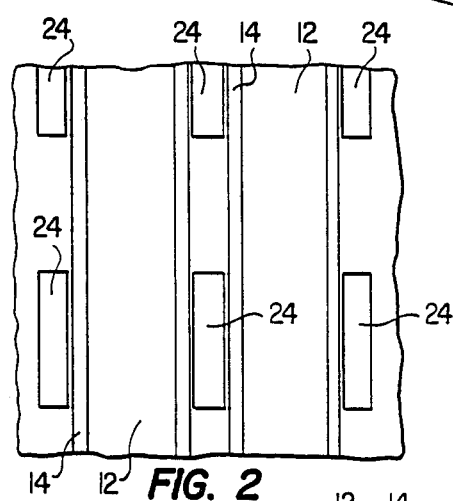
FIG. 2 is a top layout view of a portion of the memory array of the invention, illustrating the trenches located between the buried diffused bit lines.

A trench isolation of the FAMOS transistor memory cells is formed at selected areas between the diffused bit lines 14. This is commenced by spinning a photoresist over the surface of the wafer and patterning the same in the array to define openings, as shown in FIG. 2, for locating the trenches 24 between diffused bit lines 14. The wafer is then plasma etched to form the trenches 24 in the P-type silicon substrate 10. The trenches 24 are sealed with a thermal silicon oxide 27 by heating the wafer in a dry ambient to a temperature of 950 C for about 20 minutes.

The trench etch is commenced so that the first gate oxide 16 is etched away between the thick oxides 12 formed over the buried N+, and where not protected by the photoresist. In one sample embodiment, the trench etch is performed as a short etch to cut through the thin oxide 16: e.g., in a single-slice reactor, 75 sccm of He and 100 accm of $CCl_2F_2$ at 0.8 Torr and 250 Watts with a substrate temperature of 15 C. for 30 seconds; followed by a silicon etch, e.g. 180 sccm of HCl+40 sccm of HBr=80 sccm of He at a pressure of 1.3 Torr and 250 watts power and substrate temperature of 15 C, for 100 seconds. This produces a trench 24 with a depth of about 7500 A. For deeper or shallower trenches, the silicon etch is simply prolonged or shortened accordingly.

A self-aligned bit line isolation implant, i.e., screened by the bit line oxide insulator strips 12, is performed using boron-11 at 100 keV and $1.0E12cm^2$. This provides increased P-type doping in regions 25 at the bottom of trenches 24. The remaining photoresist is then stripped from the surface of the wafer. A cap oxide is then formed on the trench sidewalls, and the trench bottom by a 1000 C furnace operation, using 10 minutes in $N_2$ followed by 30 minutes in $O_2$. This cap oxidation also serves as the anneal of the bit line isolation implant. A dielectric of conformal TEOS oxide 26 is then deposited over the wafer and etched back to fill the trench 25 and planarize the top of the dielectric-filled trench. A second gate oxidation is next performed at 950 C in $O_2$+HCl to form 350 A of oxide.

In accordance with an important feature of the invention, the floating gates 18 of the FAMOS transistors are formed by growing a dummy gate oxidation (anti-Kooi-effect oxidation) at 900 C in steam to form 350 A of oxide. A photoresist is then spun and patterned to mask the first threshold voltage adjusting implant ($V_{TA}$-adjust). The threshold voltage of the FAMOS transistors are adjusted by appropriate implantation. The photoresist is next stripped using $H_2O_2/H_2SO_4$. The dummy gate oxide is stripped in a 1% HF dip. In this and other deglaze steps, the time in HF is preferably minimized to avoid excessive loss of the thick oxide 12 over buried N+ diffused bit lines 14.

A first layer of polysilicon is then deposited by low pressure chemical vapor deposition (LPCVD) techniques to a thickness of about 3000 A. This forms a first level of polysilicon (poly 1), defining layer 18. Importantly, the polysilicon layer comprises the floating gates of the EPROM memory cells. This layer 18 is doped N+ by subjecting the wafer for twenty minutes in $POCl_3$ at 950 C. A short HF dip is utilized to minimize the native oxide thickness on this layer before patterning.

Figure 3:
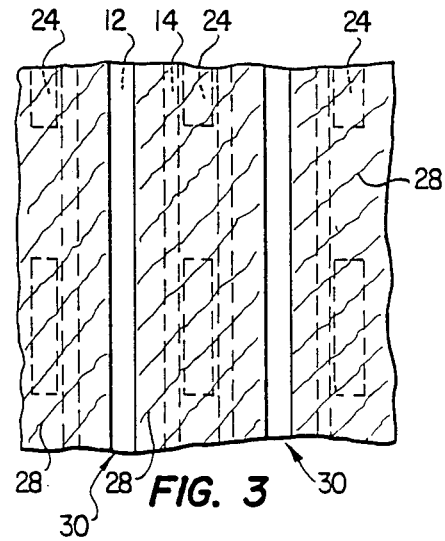
FIG. 3 illustrates the memory array portion of FIG. 2 with a mask for defining conductive strips of the floating gate structures.

A photoresist 28 is next applied and patterned according to the poly 1 pattern of FIG. 3. Essentially, an elongate opening 30 is etched in the poly 1 in alignment overlying the center of each diffused bit line 14. This is a preliminary etch to cut the floating gates 18 in the poly 1 layer to a preliminary shape. The floating gate structures are further trimmed by a subsequent stack etch described below.

An HBr/HCl plasma etch is then employed to remove unmasked portions of the poly 1. The photoresist is stripped, by ashing, and followed with a piranha process ($H_2O_2/H_2SO_4$). A 3000 A layer of oxide is then deposited by LPCVD techniques from a vapor containing tetraethylorthosilane. The oxide layer is then anisotropically etched to form sidewall filaments (not shown) of almost 3000 A maximum thickness An interlevel dielectric 20 is deposited by LPCVD techniques in a single step at 800 C. The interlevel dielectric 20 comprises 250 A of oxide followed by 150 A of nitride. The interlevel dielectric 20 is then etched away in the periphery, using a mask which covers the whole array, to permit growth of a second gate oxide which comprises the gate oxide of the active devices in the periphery. The photoresist is then stripped from the wafer.

A second level of polysilicon (poly 2) defining layer 23 is next deposited to form the control gates 23 of FAMOS transistors in the array, and to form gates of active devices in the periphery of the memory. The control gates 23 of a row of cells are formed together to define a word line of the EPROM array. A second gate oxidation step is then performed, at 900 C in steam to form 400 A of oxide. Boron-11 is implanted at an energy and dosage of 35 keV $0.5E11cm^2$ to adjust the thresholds of the NMOS devices in the periphery. The photoresist is patterned to expose only the channels of PMOS devices, and boron-11 is again implanted (35 keV,-$9E11/cm^2$) to adjust the thresholds of PMOS devices in the periphery.

Figure 4:
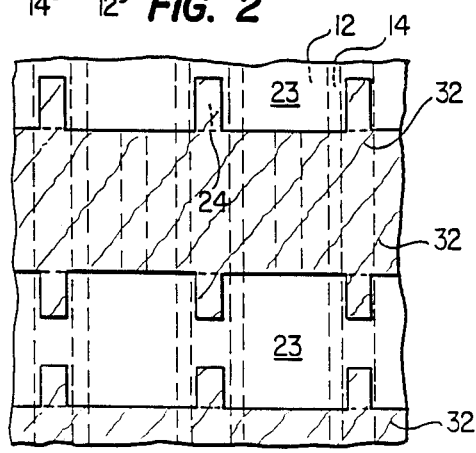
FIG. 4 illustrates the memory array portion of FIG. 3 with an additional mask for defining the shape of the word lines and the underlying floating gates.
Figure 5:
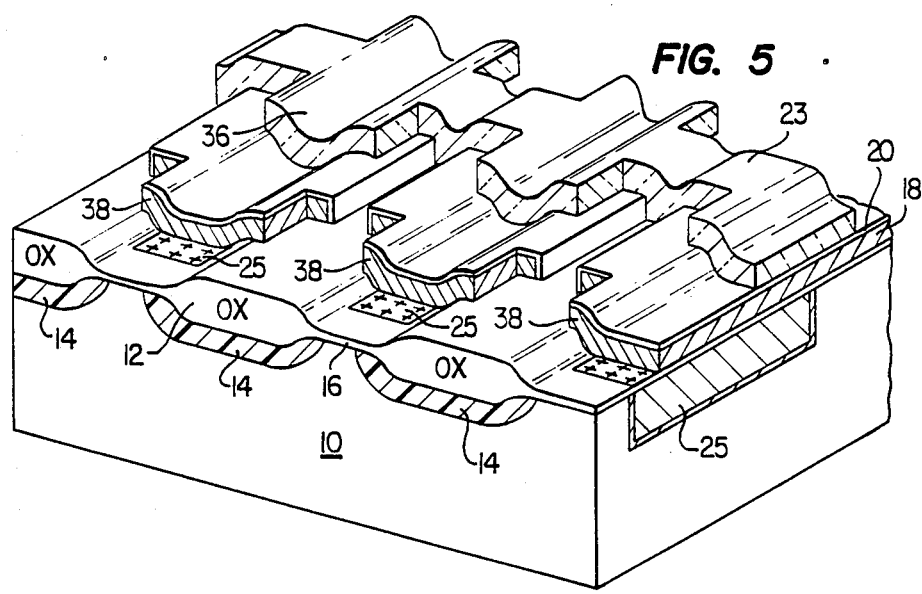
FIG. 5 illustrates the shape of the floating gates and the word lines according to one embodiment of the invention.

The photoresist 32 is also patterned, as shown in FIG. 4, to define the shape of the control gates 23 and thus also the underlying floating gates 18. A stack etch is utilized to etch the poly 2 level 23, the interlevel dielectric 20, and the poly 1 level 18. With this stack etch, the poly 1 is defined as individual floating gates 18 for each memory cell, while the poly 2 is defined as an elongate word line common to a row of memory cells, and functioning as a control gate for each such cell. Importantly, the masking and etching of both the poly 1 and poly 2 define a cross-shaped gate structure, as shown in FIG. 5, which overlies the dielectric-filled trenches 24. The photoresist is then stripped from the wafer.

The source/drain regions of the periphery devices are formed by depositing a TEOS oxide to 2500 A thickness, and etching the same to form sidewall oxides. A photoresist is then spun on the wafer and patterned to expose the source/drain regions of the NMOS devices in the periphery. Arsenic is implanted with an energy and dosage of 50 keV 5E15cm$^2$, followed by phosphorus at 50 keV 4E14cm$^2$. Another patterned photoresist layer is used to expose the PMOS source/drain regions, and boron-11 is implanted using an energy and dosage of 40 keV 3.0E15cm$^2$. The photoresist is then stripped A conformal oxide layer is next deposited over the wafer using about 1000 A of TEOS oxide, to prevent outdiffusion of the N+ and P+ implants in the periphery and to assist in gettering mobile ions The source/drain region implants are annealed, and the TEOS oxide is densified by a 900 C furnace treatment in an ambient of Ar for 60 minutes, then O$_2$ for 30 minutes, then Ar for 10 minutes.

Contacts are formed to the various memory devices and regions by utilizing a middle level oxide (MLO) For example, a borophosphosilicate glass (BPSG) containing approximately 4.5% boro and about 4.5% phosphorus is used to form the MLO.

A 900 C furnace step is employed at thirty minutes in argon to densify the BPSG. A photoresist is applied to the wafer and patterned to expose the contact hole locations. The contact holes are etched, and the remaining resist is stripped. Note that this step too applies principally to the periphery as there are no contacts in the memory array, except for occasional metal to poly 2 contacts used for strapping the word lines.

Processing continues in a conventional manner with metal patterning, for the peripheral devices only. A deglaze in 1% HF is utilized to obtain good metal adhesion, and metal is then deposited by sputtering. A dyed photoresist is deposited and patterned, the metal is plasma etched, and the resist is stripped. The structure is then heated to 450 C in H$_2$ for thirty minutes to sinter the metal and lower its contact resistance.

A protective overcoat is deposited over the wafer for environmental and physical protection. The overcoat comprises 4500 A of an oxynitride dielectric deposited by LPCVD techniques. The protective overcoat is covered with a patterned photoresist which is etched to expose metal at contact pad locations. The photoresist is then stripped from the wafer. Processing of the wafer concludes with conventional backgrind and backside gold deposition.

This foregoing results in a memory structure as shown in FIG. 1 where adjacent FAMOS transistor cells are separated, normal to their direction of current flow, by dielectric-filled trenches 24. Overlying the dielectric-filled trenches 24 are control gate 23 and floating gate extensions for increasing the capacitive coupling therebetween. Of course, the described process flow can be modified in a variety of ways. A few of the most obvious ones include use of counterdoped source/drains, use of different junction depths, use of shallower trenches, use of different substrate doping, use of different conductive materials to form the poly 1 and poly 2 levels, use of different threshold voltage adjusting implants; and a wide variety of others will be apparent to those skilled in the art. As an example, different shapes and sizes of control and floating gate extensions can be formed over the dielectric-filled trenches 24 to achieve desired coupling efficiencies between such gate structures. As a further example, the present invention is also applicable to many types of EPROMs and EEPROMs which do not use a buried N+, but rather use a more conventional surface source/drain structure. The present invention is not limited to the particular process types given, but provides a broad concept which is applicable to a wide variety of floating-gate memories. The present invention is useful in any floating-gate memory process, or other similar process, and most especially so where a stack etch is used to pattern the control gate and floating gate simultaneously.

As can be appreciated from FIG. 5, the coupling between control gate 23 and the floating gate 18 is increased due to the respective extensions 36 and 38 which are formed laterally over the dielectric-filled trenches 25. The control gates 23 and floating gates 18 resemble a cross-shaped configuration. The gate extensions 36 and 38 can extend outwardly as far as permitted by photolithographic design rules. Because the dielectric-filled trenches 25 are not active areas, no additional wafer area is required for forming the gate extensions 36 and 38 thereover. An EPROM cell construed in accordance with this embodiment provides an area increase of up to 30% over prior configurations.

As can be further appreciated from the foregoing, because of the increased area between the control gate 23 and the floating gate 18, an increased capacitance exists. For maximum programming efficiency of the EPROM cell of the invention, it is desirable to maintain a large capacitance between the control gate 23 and the floating gate 18, and a minimum capacitance between the floating gate 18 and the underlying semiconductor substrate 10, and between the floating gate 18 and the underlying N+ semiconductor material 14. The control gate 23 and the floating gate 18 structures of the invention satisfy this constraint, and thereby permit the EPROM cell to be programmed with a lower magnitude of control gate voltage, and with a shorter programming pulse applied to the selected bit line 14.

Figure 6:
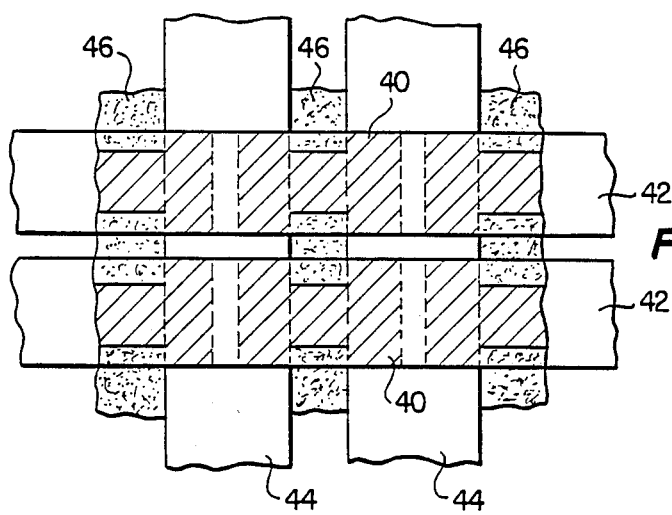
FIG. 6 is a top layout view of a word line and floating gate structure according to another embodiment of the invention.

The control gate 23 and floating gate 18 described above define only one of many possible configuration effective to improve the performance of the EPROM cell. For example, FIG. 6 illustrates a top layout view of a cell constructed in accordance with another embodiment of the invention. The memory array of this embodiment comprises a first level polysilicon insulated floating gates 40 underlying insulated wordlines or control gates 42. The bit line diffusions 44 are separated by dielectric-filled trenches 46. As noted, there are no discontinuous lateral gate extensions, rather, the entire width of both the control gate 42 and the floating gate 40 are extended over the dielectric-filled trenches 46. This configuration further increases the coupling efficiency while yet requiring no additional wafer area. An EPROM control gate 42 and floating gate 40 constructed in accordance with this embodiment can provide an area increase of up to 80% over prior configurations.

Figure 7:
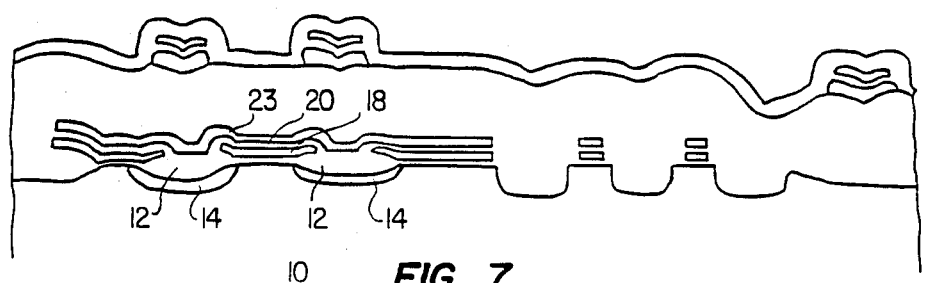
FIG. 7 shows an actual electron micrograph of a sample structure according to the present invention.

FIG. 7 illustrates an actual enlarged cross-sectional view of an EPROM cell of the invention, illustrating the dielectric-filled trenches isolating the diffused bit lines. The EPROM cell of FIG. 7 does not employ the increased gate coupling feature of the invention. The semiconductor regions and elements of FIG. 7 are identified by the same reference characters as noted in FIG. 1.

Figure 8:
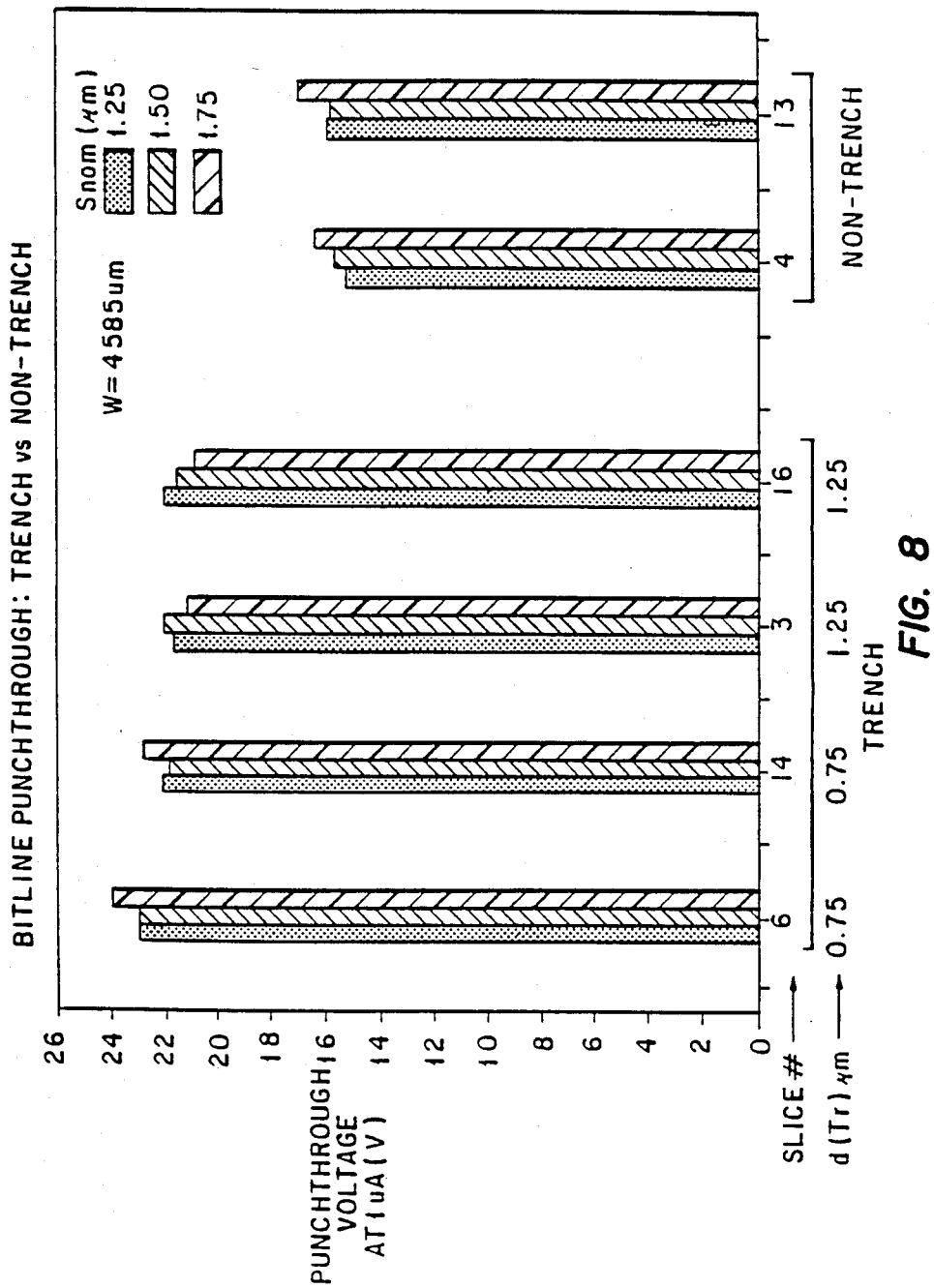
FIG. 8 shows punchthrough voltages of nominal bit line separations of 1.25, 1.5 and 1.75 micron for memory cells, according to sample embodiments of the present invention, with trench depths of 0.75 micron and 1.25 micron, and, for comparison, for similar memories which do not have trenches according to the present invention.
Figure 9:
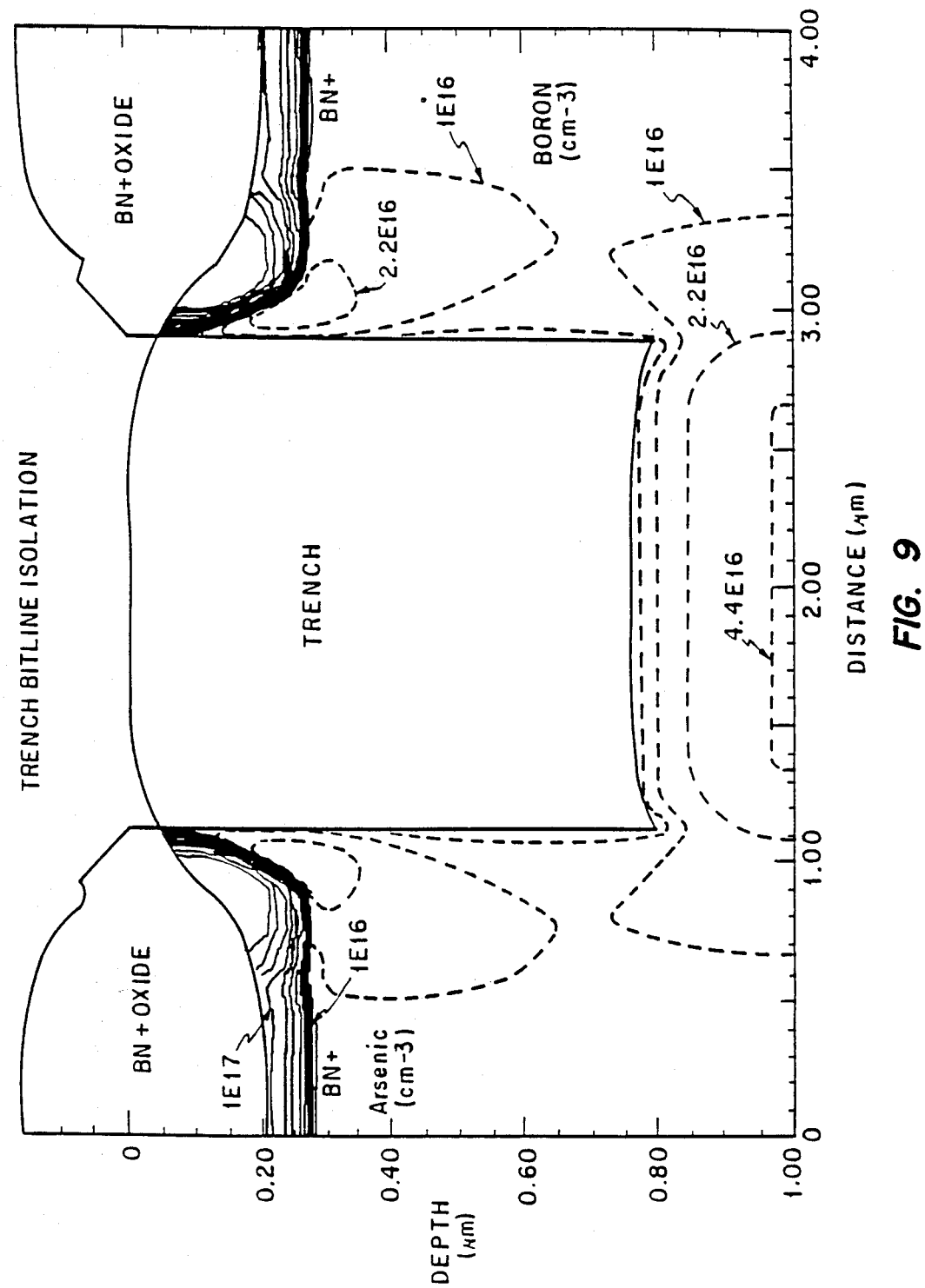
FIG. 9 shows the results of SUPRA modeling of the doping concentrations resulting from one embodiment of the process of the present invention, such results suggesting that the use of the trench structure reduces the electric field at the bit lines.

Measurements of bit line to bit line punchthrough, as defined at a leakage current density of 0.33 nA/micron, indicate a 40% improvement in punchthrough voltage relative to the non-trench values. This is shown in FIG. 8. The results also indicate that there is no marked correlation between punchthrough and the trench depths of 0.75 and 1.25 micron, nor for the trench slices, between punchthrough and bit line spacing. These results suggest that breakdown to substrate may be the limiting factor. SUPRA modeling of the doping concentrations resulting from one embodiment of the process used produced the results shown in FIG. 9 which indicates that the use of the trench structure reduces the electric field at the bit lines. It is believed that by forming the control and floating gates overlying the dielectric-filled trenches, the noted fringing fields will be further reduced.

Figure 10:
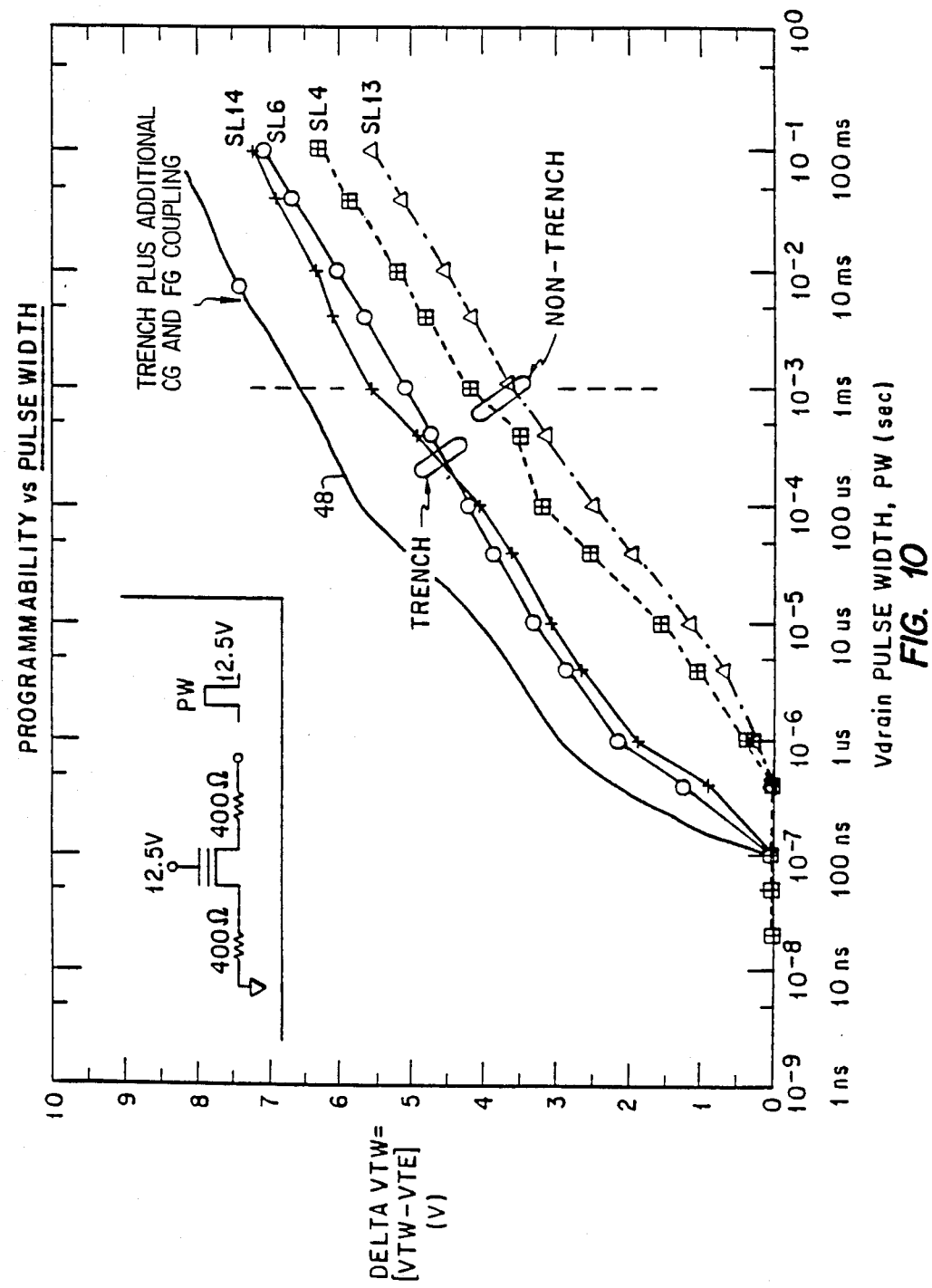
FIG. 10 shows variable pulse width programming data from two slices with bit line trench isolation and from two slices without trenches; this data appears to show an enhancement in programmability, relative to the non-trench, ranging from 22% at a pulse width of 1 ms to 475% at 1 microsecond, reflecting the earlier programming of the trench structure.

The dependence of FAMOS programmability on pulse programming parameters was determined by correlating the change in programmed threshold voltage, delta $V_{TW}$, with: drain voltage pulse width, gate voltage, drain voltage pulse height and the number of drain voltage pulses. In all cases, significant increases in programmability were observed for FAMOS transistors with trench isolation. As an example, FIG. 10 shows variable pulse width data from two slices with bit line trench isolation and from two slices without trenches. This shows an enhancement in programmability, relative to the non-trench, ranging from 22% at a pulse width of 1 ms to 475% at a microsecond, reflecting the earlier programming of the trench. It has also been observed (in five slices from 2 lots) that trench isolated FAMOS transistors consistently and characteristically programmed at 400 nsec to a delta $V_{TW}$ of 0.8 to 1.2V, whereas the non-trench FAMOS showed no programming at 400 nsec.

The top curve 4S is believed to be representative of the programmability of the EPROM cell of the invention employing the noted dielectric-filled trenches 24 and the increased coupling efficiency due to the increased area of the control and floating gate structures. As noted by curve 48, for a given delta $V_{TW}$, the programing pulse width is shorter than the other noted cells.

Figure 11:
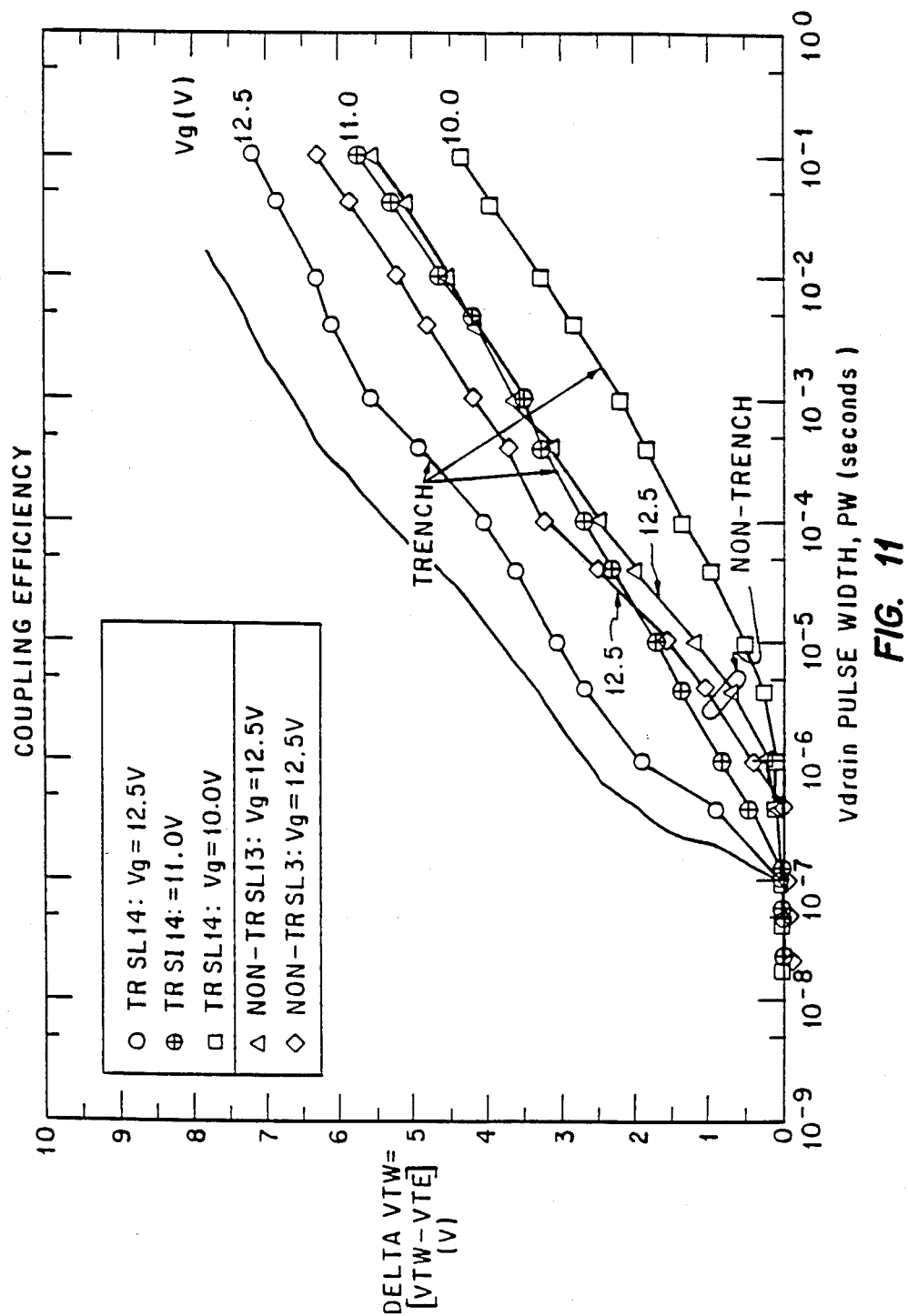
FIG. 11 shows data on Δ VTW versus pulse width for three trench and two non-trench slices, which appears to indicate that the programmed state attained by the non-trench FAMOS at a gate voltage of 12.5V could be achieved by the trench FAMOS at 11V, suggesting an increase in coupling efficiency of about 12%.

While the exact causes of enhanced programmability due to trench isolation are not fully known, one probable mechanism, and probably only a partial cause, is the observed increase in coupling efficiency between control and floating gates. Data in FIG. 11 indicates that the programmed state attained by the non-trench FAMOS transistor cell at a gate voltage of 12.5V could be achieved by the trench FAMOS transistor cell at 11V, thus suggesting an increase in coupling efficiency of about 12%. Operating in conjunction with the enhanced coupling due to the dielectric-filled trenches 24 is the increased area of the control gate and floating gate. The top line of the graph of FIG. 11 signifies that the coupling efficiency of a floating gate type memory cell is further enhanced by the invention. Functionality in a 64K EPROM array has been demonstrated.

In the presently preferred embodiment, this structure is configured as a 1 megabit EPROM. Literature on other contemporary EPROMS of comparable size may be found in K. Komori et al. (Hitachi), 1985 *IEDM Technical Digest*, pages 627–628; and K. Sekiya et al. (NEC), VLSI Symposium (San Diego, May 1986); which are both hereby incorporated by reference.

The memory thus constructed is read by raising one word line to a voltage intermediate the threshold voltages of FAMOS transistors in "1" or "0" states, driving one bit line to a known voltage, and sensing the current on a bit line adjacent to the driven bit line to sense the stored state of the addressed cell. The cell is written by driving one word line and one bit line high, while the adjacent bit line is held low, so that hot carriers can be generated at the N+. junction of the buried bit line diffusion 14 and injected through the oxide 16 into the poly 1 floating gate 18.

It should be noted that the present invention is not only applicable to EPROMs like those described, but also to other kinds of floating gate memories, and specifically to EEPROMs Of course the polysilicon gate layers so frequently referred to in the present application do not have to be strictly polysilicon, but can be other materials which are substantially polycrystalline or amorphous and contain a large fraction of silicon; in this usage silicides and polysilicon/silicide sandwich structures are certainly comprehended, and future sandwich structures which have analogous deposition and electrical properties in future processes may replace the polysilicon in present processes are intended to be comprehended also. The use of a polycide structure as the poly 2 level in the principal preferred embodiment is only one example of the range of technical possibilities here.

While the preferred embodiment of the method and apparatus of the invention have been disclosed with reference to specific semiconductor memory structures, it is to be understood that many changes in detail may be made as a matter of engineering choices without departing from the spirit and scope of the invention, as defined by the appended claims.

What is claimed is:

1. A non-volatile memory cell array, comprising: a semiconductor body;
    a plurality of bit line diffusions extending along a surface of said semiconductor body;
    a plurality of word lines crossing said bit line diffusions;
    a plurality of floating gates, each floating gate underlying one of said word lines at a location between a pair of said bit line diffusions, each said floating gate defining a transistor channel location substantially thereunder; and
    a plurality of trenches in said semiconductor body, each of said trenches for isolating adjacent ones of said channel locations in the direction said bit line diffusions extend;
        wherein said word lines and said floating gates each include a first extension overlying an adjacent trench, each first floating gate extension underlying a first extension of its overlying word line.

2. The device of claim 1, wherein said floating gates comprise polycrystalline silicon.

3. The device of claim 1, wherein said word lines comprise polycrystalline silicon.

4. The device of claim 1, wherein said trenches are filled with a dielectric material.

5. The device of claim 1, wherein said transistor channel locations define respective floating gate transistors having portions of respective ones of said bit line diffusions as respective source and drain electrodes.

6. The device of claim 1, wherein said floating gates each further include a second extension overlying the adjacent trench on the opposite side of said channel region from said first extension.

7. The device of claim 1, further comprising:
bit line insulator strips, overlying said bit line diffusions;
wherein said floating gates each further include extensions over the adjacent bit line insulator strips.

8. A non-volatile memory cell array, comprising:
a semiconductor body;
a plurality of substantially parallel bit line insulator strips extending along a surface of said semiconductor body;
a plurality of bit line diffusions, each underlying one of said bit line insulator strips;
a plurality of word lines crossing said bit line diffusions;
a plurality of floating gates, each floating gate underlying one of said word lines at a location between a pair of said bit line diffusions, each said floating gate defining a transistor channel location substantially thereunder; and
a plurality of dielectric-filled trenches in said semiconductor body, each of said trenches for isolating adjacent ones of said channel locations in the direction said bit line insulator strips extend;
wherein said word lines and said floating gates each include a first extension overlying an adjacent dielectric-filled trench, each first floating gate extension underlying a first extension of its overlying word line 9. The device of claim 8, wherein said floating gates comprise polycrystalline silicon.

10. The device of claim 8, wherein said word lines comprise polycrystalline silicon.

11. The device of claim 8, wherein said trenches are filled with a silicon oxide dielectric material.

12. The device of claim 8, wherein said transistor channel locations define a floating gate transistor having portions of respective ones of said bit line diffusions as respective source and drain electrodes.

13. The device of claim 8, wherein said floating gates each further include a second extension overlying the adjacent trench on the opposite side of said channel region from said first extension.

14. The device of claim 8 wherein said floating gates each further include extensions over the adjacent bit line insulator strips.

* * * * *